United States Patent [19]

Cave et al.

[11] Patent Number: 4,590,389

[45] Date of Patent: May 20, 1986

[54] COMPENSATION CIRCUIT AND METHOD FOR STABILIZATION OF A CIRCUIT NODE BY MULTIPLICATION OF DISPLACEMENT CURRENT

[75] Inventors: David L. Cave; Byron G. Bynum, both of Tempe, Ariz.

[73] Assignee: Motorola Inc., Schaumburg, Ill.

[21] Appl. No.: 596,191

[22] Filed: Apr. 2, 1984

[51] Int. Cl.[4] .................... H03K 3/26; G06G 7/10; G06G 7/12

[52] U.S. Cl. .................... 307/303; 307/491; 307/499; 307/542; 307/567

[58] Field of Search .................... 307/296 R, 297, 304, 307/573, 443, 446, 491, 501, 570, 572, 575, 578, 200 B, 583, 540, 542, 544, 546, 547, 549, 567, 550, 568, 303, 499

[56] References Cited

U.S. PATENT DOCUMENTS

| 4,168,442 | 9/1979 | Satou et al. ............. | 307/304 |
|---|---|---|---|
| 4,209,713 | 6/1980 | Satou et al. ............. | 307/200 B |
| 4,371,797 | 2/1983 | Frank .................. | 307/577 |
| 4,377,756 | 3/1983 | Yoshihara et al. ........ | 307/296 R |
| 4,384,218 | 5/1983 | Shimotori et al. ........ | 307/304 |
| 4,388,537 | 6/1983 | Kanuma ................ | 307/297 |
| 4,430,581 | 2/1984 | Mogi et al. ............. | 307/296 R |
| 4,473,761 | 9/1984 | Peterson ................ | 307/583 |
| 4,491,746 | 1/1985 | Koike .................. | 307/296 R |

OTHER PUBLICATIONS

Chang, "FET N-Channel Threshold Voltage-Control Circuit", IBM Tech. Disclosures, vol. 17, No. 1, 6/74, p. 140.

Harroun, "Substrate Bias Voltage Control", IBM Tech. Disclosure, vol. 22, No. 7, 12/79, p. 2691.

Cassidy et al., "Substrate Voltage Regulator", IBM Tech. Disclosure, vol. 27, No. 2, 7/84, p. 1137.

Primary Examiner—Larry N. Anagnos
Assistant Examiner—Timothy P. Callahan
Attorney, Agent, or Firm—William J. Kubida; Dale E. Jepsen

[57] ABSTRACT

A compensation circuit for stabilization of a circuit node coupled to an integrated circuit substrate by a parasitic capacitance of a value $C_1$ has a displacement current substantially equal to $C_1 \, dv/dt$. A switching device having a gain beta can either supply a current to, or draw a current from, the circuit node substantially equal to $C_2 \beta \, dv/dt$ which is greater than the displacement current thereby obviating oscillation of an integrated circuit output due to capacitive coupling of the substrate to sensitive circuit nodes.

16 Claims, 6 Drawing Figures

- PRIOR ART -

- PRIOR ART -

COMPENSATION CIRCUIT AND METHOD FOR STABILIZATION OF A CIRCUIT NODE BY MULTIPLICATION OF DISPLACEMENT CURRENT

BACKGROUND OF THE INVENTION

The present invention relates, in general, to the field of compensating circuits and methods for stabilization of a circuit node in an integrated circuit by multiplication of junction capacitance displacement current. More particularly, the present invention relates to a compensation circuit and method which multiplies junction capacitance displacement current to provide stabilization of a sensitive circuit node which might otherwise oscillate due to capacitive coupling of the substrate when used as an output in certain integrated circuit technologies.

In the utilization of an N type epitaxial layer or well in conjunction with a P+ substrate and isolation regions, a diode exists at the junctions between the epitaxial layer and the substrate/isolation regions. Moreover, these junctions exhibit an associated parasitic capacitance, or junction capacitance.

This junction capacitance can create problems with many newer technology integrated circuits which take advantage of large output devices utilizing the substrate as an output terminal. Exemplary of such new devices are power vertical PNPs as well as bottom collector NPNs and CMOS/TMOS ™ devices. These new technologies are currently being developed by numerous semiconductor manufacturers, including Motorola Inc., assignee of the present invention and owner of the trademark TMOS.

In the utilization of such "bottom technology" devices, when the output, taken at the substrate, swings rapidly, large displacement currents may flow through the parasitic capacitance associated with the junction isolation. Such circuits may therefore become extremely susceptible to this capacitive current. In such instances, the output of the device, rather than turning off at the appropriate time may oscillate between the supply voltage level, $V_{CC}$ and circuit ground due to induced displacement current at a sensitive circuit node in the device control circuitry.

SUMMARY OF THE INVENTION

It is therefore an object of the present invention to provide an improved compensation circuit and method for stabilization of a circuit node by multiplication of displacement current.

It is further an object of the present invention to provide an improved compensation circuit and method for stabilization of a circuit node by multiplication of displacement current which provides stabilization to an integrated circuit output which might otherwise oscillate due to capacitive coupling of the substrate to the circuit node.

It is still further an object of the present invention to provide an improved compensation circuit and method for stabilization of a circuit node by multiplication of displacement current which is readily integrated and implemented utilizing a minimum of on-chip area.

The foregoing and other objects are achieved in the present invention wherein there is provided a compensation circuit and method for stabilization of a circuit node coupled to an integrated circuit substrate by a parasitic capacitance having a value $C_1$ and having a displacement current to the substrate substantially equal to $C_1$ dv/dt. The compensation circuit includes a switching device having a gain beta ($\beta$) and first, second and third terminals thereof, the first terminal being coupled to a supply voltage line, the second terminal being coupled to the substrate by a parasitic capacitance of a value $C_2$ and the third terminal thereof being connected to the circuit node. In operation, the switching device supplies a current to the circuit node substantially equal to $C_2 \beta$ dv/dt which is greater than the displacement current. Alternative embodiments of the compensation circuit and method of the present invention include a diode having anode and cathode terminals thereof, the cathode terminal being coupled to the supply voltage line and the anode terminal being connected to the second terminal of the switching device. In some applications, the diode may comprise an NPN bipolar transistor.

In accordance with an alternative embodiment of the present invention a compensation circuit and method is provided which includes a switching device having a gain beta and first, second and third terminals thereof, the first terminal being coupled to a circuit node and the second and third terminals being coupled to the substrate by a parasitic capacitance of a value $C_2$. A diode having anode and cathode terminals thereof has its cathode terminal coupled to a supply voltage line and its anode connected to the second and third terminals of the switching device. In this embodiment, incorporating an inverted phase, the switching device draws a current from a circuit node substantially equal to $C_2 \beta$ dv/dt which is greater than the displacement current.

BRIEF DESCRIPTION OF THE DRAWINGS

The above-mentioned, and other features and objects of the present invention and the manner of attaining them will become more apparent and the invention itself will be best understood by reference to the following description of an embodiment of the invention taken in conjunction with the accompanying drawings, wherein.

DESCRIPTION OF A PREFERRED EMBODIMENT

Figure 1:
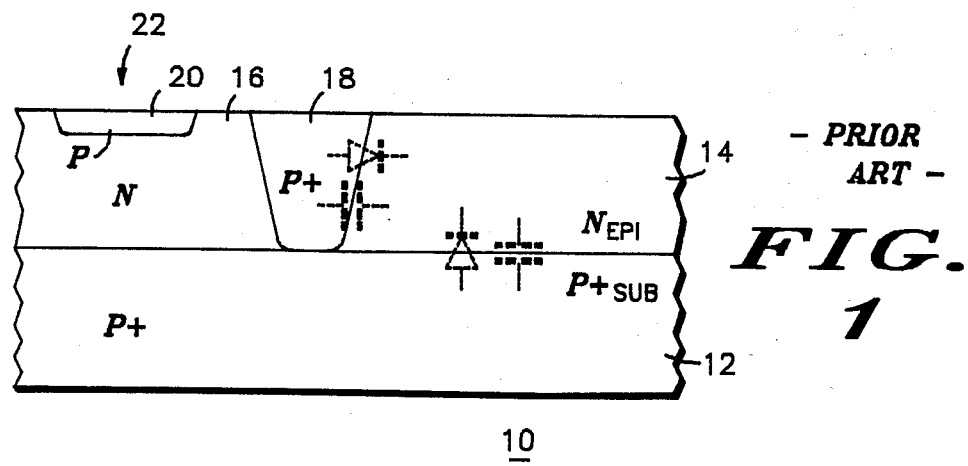
FIG. 1 is a simplified cross sectional view of a portion of a prior art integrated circuit useful in illustrating the parasitic capacitances inherent at the substrate and isolation region junctions with an epitaxial layer, and illustrating a vertical PNP transistor.

Referring now to FIG. 1, a portion of a prior art integrated circuit 10 is shown. Integrated circuit 10 comprises, in major part, a P+ substrate 12 having N epitaxial layers 14, 16 separated by an isolation region 18. A vertical PNP transistor comprising P region 20, N epitaxial layer 16 and P+ substrate 12 is also shown. At the junction of, for example, N epitaxial layer 14 with P+ substrate 12 and the P+ isolation region 18, normally reverse biased diodes exist between the N and P+ materials. Moreover, an inherent parasitic capacitance also exists at these junctures. In the utilization of such vertical PNP transistors 22, when the substrate is utilized as $V_{OUT}$, large displacement currents may flow through the capacitances associated with the junction capacitance.

Figure 2:
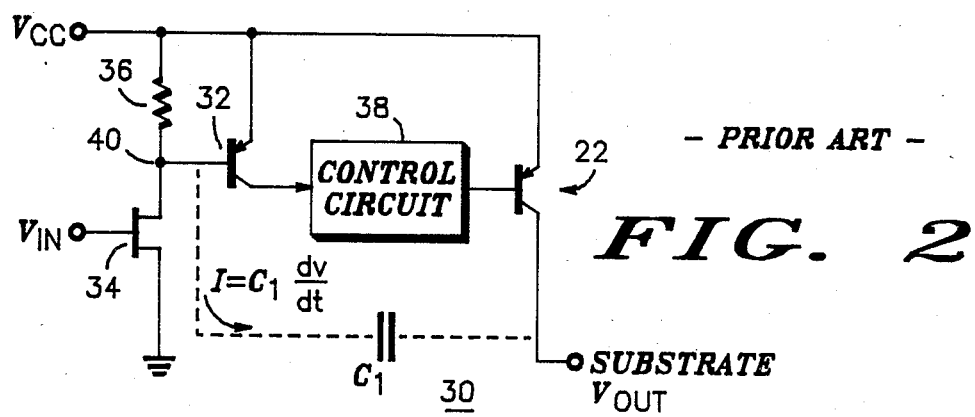
FIG. 2 is a generalized schematic and block diagram representation of a portion of a prior art power BIMOS circuit useful in illustrating the displacement current from a circuit node due to the parasitic capacitances shown in FIG. 1 which might result in oscillation of $V_{OUT}$.

Referring additionally now to FIG. 2, a BIMOS circuit 30 is shown which is useful in illustrating the displacement current from a circuit node due to the parasitic capacitances shown in FIG. 1 which might result in oscillation of $V_{OUT}$. BIMOS circuit 30 comprises, in general, vertical PNP transistor 22 coupled between a supply voltage line, $V_{CC}$ and the device substrate utilized as $V_{OUT}$. The base terminal of vertical PNP transistor 22 is connected to the output of a control circuit 30 having as input the collector terminal of PNP transistor 32. The emitter of PNP transistor 32 is also connected to $V_{CC}$. Likewise, the base terminal of PNP transistor 32 is connected to $V_{CC}$ by resistor 36, and the base terminal of PNP transistor 32 defines a sensitive circuit node 40 at the epitaxial layer of the integrated circuit. Node 40 is connected to the drain of MOSFET 34 having its source connected to circuit ground. The gate terminal of MOSFET 34 is connected to $V_{IN}$.

In operation, BIMOS circuit 30 functions such that when $V_{IN}$ is at a logic high level, MOSFET 34 turns on thus turning PNP transistor 32 on. When this happens, vertical PNP transistor 22 is saturated. When $V_{IN}$ is at a logic low level, MOSFET 34 turns off, thereby turning off PNP transistor 32 and, hence, vertical PNP transistor 22. At this time, the substrate begins to fall but a displacement current in the junction capacitance may turn PNP transistor 32 back on if the displacement current, $C_1$ dv/dt through resistor 36 creates a voltage greater than the $V_{BE}$ of PNP transistor 32. In this instance, $V_{OUT}$ rather than turning off, may oscillate between $V_{CC}$ and ground. Such oscillation problems may be particularly noticeable with high impedance nodes where the output changes voltage very rapidly. In such instances, even more current may be pulled out of node 40 with the resultant oscillation of $V_{OUT}$ above described. It should be noted, that a parasitic capacitance exists between the substrate and every epitaxial region in the circuit, including those within control circuit 38 such that a displacement current develops each time the substrate moves with respect to $V_{CC}$. While this phenomena has been shown with respect to node 40 only, it should be remembered that there exists a number of places within an integrated circuit where such displacement current may create a problem. For example, other areas of concern would include epitaxial tubs which are pulled down containing an MOS transistor and resistors which provide positive feedback to $V_{OUT}$.

Figure 3:
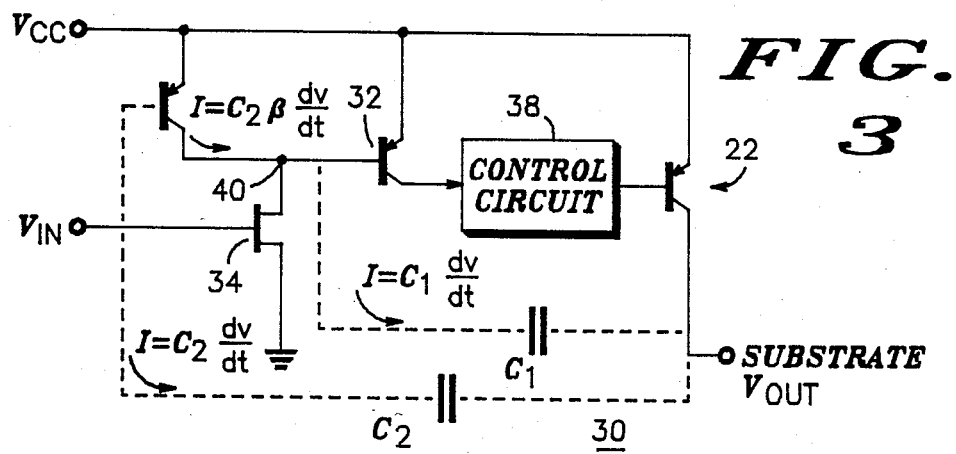
FIG. 3 is an extension of the generalized schematic and block diagram representation of FIG. 2 utilizing a compensation circuit in accordance with the present invention and illustrating the use of a PNP transistor as a switching device of gain beta to stabilize a circuit node from the displacement current shown in FIG. 2.

Referring additionally to FIG. 3 an expanded schematic of BIMOS circuit 30 is shown utilizing a compensation circuit in accordance with the present invention. In this embodiment, the compensation circuit comprises PNP transistor 42 functioning as a switching device of gain beta. PNP transistor 42 has its emitter connected to $V_{CC}$ and its collector connected to node 40. The base of PNP transistor 42 is the epitaxial layer of the integrated circuit itself and exhibits a parasitic capacitance to the substrate of $C_2$. Thus, a displacement current of $C_2$ dv/dt on the base of PNP transistor 42 would correspond to a collector current to node 40 of $C_2 \beta$ dv/dt. Thus, the current supplied to node 40 is $C_2 \beta$ dv/dt while the displacement current due to the capacitance between the base of PNP transistor 32 is $C_1$ dv/dt. Resultantly, if $C_1 = C_2$, $\beta$ times more current will be placed into node 40 by PNP transistor 42 than is pulled out of node 40 by the parasitic capacitance $C_1$ when the substrate voltage drops.

It should be noted, that while the compensation circuit of the present invention shows the current being injected into node 40, in many applications the compensation could be applied to a master shutdown point in the control circuit.

Figure 4:
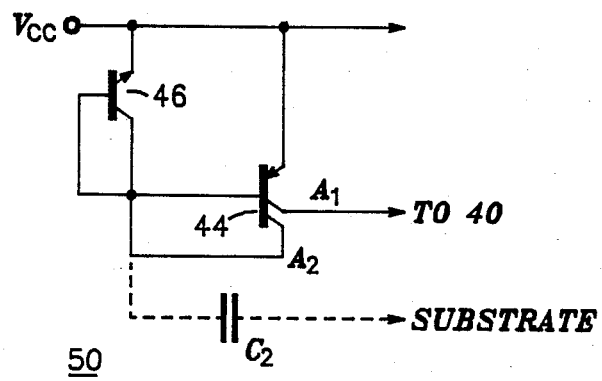
FIG. 4 illustrates an alternative embodiment of the compensation circuit of FIG. 3 utilizing a split collector PNP transistor to control the device beta by ratioing the collector areas, as well as a shunt diode to provide a low impedance AC signal path under forward biased conditions.

Referring additionally now to FIG. 4, a compensation circuit 50 is shown which may be utilized in place of the compensation circuit of FIG. 3 comprising PNP transistor 42. Compensation circuit 50 comprises in major part a split collector PNP transistor 44 functioning as a switching device of gain beta. The beta of split collector PNP transistor 44 is effectively the ratio of the areas of collectors $A_1/A_2$. The emitter of split collector PNP transistor 44 is connected to $V_{CC}$ and collector $A_1$ is connected to node 40. Collector $A_2$ is connected to the base of split collector PNP transistor 44 which is the N epitaxial layer of the integrated circuit.

A diode 46 couples the base of split collector PNP transistor 44 to $V_{CC}$. In the embodiment illustrated, diode 46 comprises an NPN transistor having its emitter connected to $V_{CC}$ and its base and collector terminals common connected to the base of split collector PNP transistor 44. Compensation circuit 50 has associated therewith a parasitic capacitance $C_2$ to the substrate.

Compensation circuit 50 has advantages with respect to the compensation circuit of FIG. 3 in that should the substrate swing negative and pull current through the capacitance $C_2$ it will charge that capacitance from positive to negative as current through the base emitter junction of PNP transistor 42 of FIG. 3 or split collector PNP transistor 44 of FIG. 4. However, when the substrate goes back up to $V_{CC}$, there is no way for capacitor $C_2$ to discharge in that a reverse bias diode is found in the base emitter of PNP transistor 42 or split collector PNP transistor 44. Thus, the charge stored on the capacitor will remain and no current will flow. Resultantly, on the next transition of the substrate, $C_2$ is already charged. In order to discharge this capacitance a high value resistance could be placed on the base of either PNP transistor 42 or split collector PNP transistor 44 and tied to AC ground ($V_{CC}$). Therefore, when the substrate moves positively towards $V_{CC}$ the capacitance $C_2$ can discharge through the resistor. However, a disadvantage in the utilization of a resistor is that it must be quite large in value, and for that reason, current will be lost through it when the substrate transitions negatively. Therefore, diode 46 is utilized with split collector PNP transistor 44 in compensation circuit 50 and may likewise be utilized in conjunction with PNP transistor 42 of FIG. 3. Diode 46 provides a complete AC path for current to discharge capacitance $C_2$. Diode 46 becomes reverse biased such that all of the current that flows into capacitor $C_2$ as the substrate goes negative has to come through the base of split collector PNP transistor 44. On the other hand, when the substrate moves positively, current can flow through diode 46 to $V_{CC}$. However, there could be leakage at the base of split collector PNP transistor 44, e.g. leakage of the diode forming $C_2$ to the substrate. Thus, collector $A_2$ is tied back to the anode of diode 46. Were this not done, the leakage current could appear as base current for split collector PNP transistor 44 and it would get multiplied by the gain of the device and would leak into the circuitry. This is, therefore, effectively controlled by tying collector $A_2$ back to the base, which is the epitaxial layer, to effectively control the beta of the device. As above described, the beta of split collector PNP transistor 44 is effectively $A_1/A_2$.

Figure 5A:
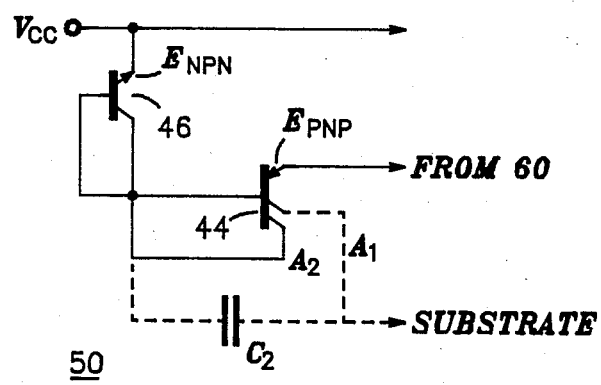
FIGS. 5A and 5B illustrate schematically, and by device layout, a further embodiment of the compensation circuit of FIG. 3 which operates with inverted
Figure 5B:
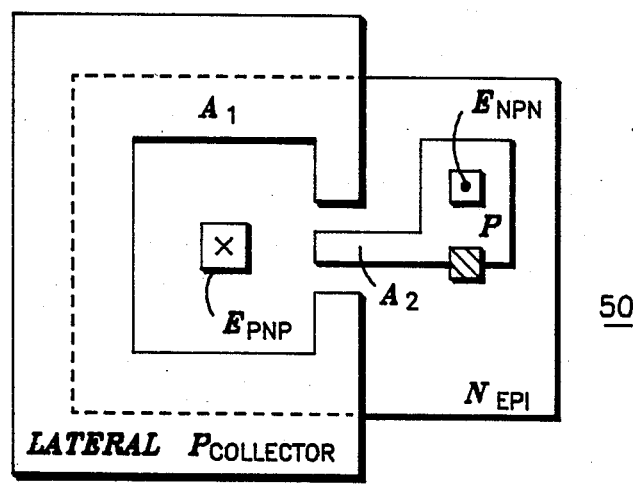

Referring additionally now to FIGS. 5A and 5B, an alternative embodiment for compensation circuit 50 is likewise shown. In this embodiment, compensation circuit 50 comprises split collector PNP transistor 44 having its emitter connected to node 60 requiring inverted phase to compensate for displacement current instead of $V_{CC}$ as shown in FIG. 4. Additionally, collector $A_1$ is connected directly to substrate. All remaining connections of compensation circuit 50 are as previously described with respect to FIG. 4.

Utilizing the embodiments of compensation circuit 50 shown in FIGS. 5A and 5B the collector split of split collector PNP transistor 44 allows the gain of the device to be controlled by the ratio of the two collector areas as above described. This current gain control allows for the adjustment of injected current as well as leakage current. However, as above described, the embodiment of compensation circuit 50 shown in FIGS. 5A and 5B depicts an embodiment of the invention which operates with inverted phase with respect to the embodiment of FIG. 4. Thus, current will be pulled from node 60 to prevent inadvertent turn-on of a circuit where inverted phase is necessary. Utilizing this embodiment, a compact two-terminal network may be provided which takes up very little on-chip space as shown.

What has been provided therefore is an improved compensation circuit and method for stabilization of a circuit node by multiplication of displacement current which provides stabilization to an integrated circuit output which might otherwise oscillate due to capacitive coupling of the substrate to the voltage node. The compensation circuit and method of the present invention is readily integrated and utilizes a minimum of on-chip area.

While there have been described above the principles of the invention in conjunction with specific apparatus, it is to be clearly understood that these descriptions are made only by way of example and not as a limitation to the scope of the invention.

We claim:

1. In an integrated circuit comprising a supply voltage line, a substrate of a first impurity type, an epitaxial region of a second impurity type and a circuit node in said epitaxial region, wherein the output is intended to be taken from said substrate and having parasitic capacitance between said substrate and said epitaxial region, the improvement comprising a compensation circuit which comprises a switching device having first, second and control terminals thereof, said first terminal being coupled to said supply voltage line, said control terminal being coupled to said substrate by said parasitic capacitance and said second terminal thereof being connected to said circuit node, said switching device for supplying a current to said circuit node being sufficient to prevent unwanted oscillations.

2. The compensation circuit of claim 1 further comprising:

a diode having anode and cathode terminals thereof, said cathode terminal being coupled to said supply voltage line and said anode terminal being connected to said control terminal of said switching device.

3. The compensation circuit of claim 2 wherein said diode comprises an NPN bipolar transistor having an emitter as said cathode and a common connected base and collector as said anode.

4. The compensation circuit of claim 1 wherein said switching device is a PNP bipolar transistor.

5. The compensation circuit of claim 1 wherein said first, control and second terminals of said switching device are a emitter, base, and collector terminal respectively.

6. A method for stabilization of a circuit node coupled to an integrated circuit substrate by a parasitic capacitance of a value $C_1$ and having a displacement current to said substrate substantially equal to $C_1\, dv/dt$ comprising:

providing a switching device having a gain $\beta$ and first, second and third terminals thereof;

firstly coupling said first terminal to a supply voltage line;

secondly coupling said second terminal to said substrate by a parasitic capacitance of a value $C_2$;

connecting said third terminal to said circuit node; and supplying by means of said switching device a current to said circuit node substantially equal to $C_2 \beta\, dv/dt$ which is greater than said displacement current.

7. The method of claim 6 further comprising the step of:

shunting said switching device by means of a diode having anode and cathode terminals thereof, said cathode being coupled to said supply voltage line and said anode being connected to said second terminal of said switching device.

8. The method of claim 7 wherein said step of shunting is carried out by means of an NPN bipolar transistor having an emitter as said cathode and a common connected base and collector as said anode.

9. The method of claim 6 wherein said step of providing is carried out by means of a PNP bipolar transistor.

10. In an integrated circuit comprising a supply voltage line, a substrate of a first impurity type, an epitaxial region of a second impurity type and a circuit node in said epitaxial region wherein the output is intended to be taken from said substrate and having parasitic capacitance between said substrate and said epitaxial region, the improvement comprising a compensation circuit which comprises:

a switching device having first, second and control terminals thereof, said first terminal being coupled to said circuit node and said second and control terminals being coupled to said substrate by said parasitic capacitance; and a diode having anode and cathode terminals thereof, said cathode terminal being coupled to said supply voltage line and said anode being connected to said second and control terminals of said switching device, said switching device for drawing a current from said circuit node being sufficient to prevent unwanted oscillations.

11. The composition circuit of claim 10 wherein said diode comprises a NPN bipolar transistor having an emitter as said cathode and a common connected base and collector as said anode.

12. The compensation circuit of claim 10 wherein said switching device comprises a bipolar PNP transistor.

13. The compensation circuit of claim 10 wherein said first, control and second terminals of said switching device are a emitter, base and collector terminal respectively.

14. A method for stabilization of a circuit node coupled to an integrated circuit substrate by parasitic capacitance of a value $C_1$ and having a displacement current to said substrate substantially equal to $C_1 \, dv/dt$ comprising:

providing a switching device having a gain $\beta$ and first, second and third terminals thereof;

connecting said first terminal to said circuit node;

coupling said second and third terminals to said substrate by a parasitic capacitance of a value $C_2$;

furnishing a diode having anode and cathode terminals thereof, said cathode being coupled to a supply voltage line and said anode being connected to said second and third terminals of said switching device; and drawing by means of said switching device a current from said circuit node substantially equal to $C_2 \beta \, dv/dt$ which is greater than said displacement current.

15. The method of claim 14 wherein said step of furnishing is carried out by means of an NPN bipolar transistor having an emitter as said cathode and a common connected base and collector as said anode.

16. The method of claim 14 wherein said step of providing is carried out by means of a PNP bipolar transistor.

* * * * *